(12) United States Patent
Hashimoto

(10) Patent No.: US 7,741,676 B2
(45) Date of Patent: Jun. 22, 2010

(54) SEMICONDUCTOR APPARATUS AND MANUFACTURING METHOD USING A GATE CONTACT SECTION AVOIDING AN UPWARDLY STEPPED POLYSILICON GATE CONTACT

(75) Inventor: Yasunori Hashimoto, Miki (JP)

(73) Assignee: Ricoh Company, Ltd., Tokyo (JP)

( * ) Notice: Subject to any disclaimer, the term of this patent is extended or adjusted under 35 U.S.C. 154(b) by 69 days.

(21) Appl. No.: 11/904,917

(22) Filed: Sep. 27, 2007

(65) Prior Publication Data

US 2008/0079081 A1    Apr. 3, 2008

(30) Foreign Application Priority Data

Sep. 29, 2006    (JP) ............... 2006-266827

(51) Int. Cl.
    H01L 29/76    (2006.01)
    H01L 29/94    (2006.01)
    H01L 31/062   (2006.01)
    H01L 31/113   (2006.01)
    H01L 31/119   (2006.01)

(52) U.S. Cl. ............ 257/330; 257/331; 257/332; 257/333; 257/334; 257/E29.201

(58) Field of Classification Search ......... 257/330–334, 257/E29.201
    See application file for complete search history.

(56) References Cited

U.S. PATENT DOCUMENTS

| | | | | |
|---|---|---|---|---|
| 6,614,068 B1* | 9/2003 | Chung | ............ | 257/306 |
| 6,774,439 B2* | 8/2004 | Fukuzumi et al. | ...... | 257/360 |
| 6,798,018 B2* | 9/2004 | Takaishi et al. | ......... | 257/334 |
| 6,803,281 B2* | 10/2004 | Numazawa et al. | ..... | 438/270 |
| 6,940,145 B2* | 9/2005 | Blair et al. | ............. | 257/510 |
| 6,987,305 B2* | 1/2006 | He et al. | ............. | 257/417 |
| 7,087,958 B2* | 8/2006 | Chuang et al. | ........ | 257/335 |
| 7,508,030 B2* | 3/2009 | Kobayashi | ............ | 257/330 |
| 2006/0180856 A1* | 8/2006 | Nakazawa et al. | ...... | 257/330 |
| 2006/0273382 A1* | 12/2006 | Hshieh | ............... | 257/330 |
| 2006/0273385 A1* | 12/2006 | Hshieh | ............... | 257/330 |
| 2008/0035987 A1* | 2/2008 | Hebert | ............... | 257/330 |
| 2008/0035988 A1* | 2/2008 | Hshieh | ............... | 257/330 |
| 2008/0042194 A1* | 2/2008 | Hshieh | ............... | 257/331 |

(Continued)

FOREIGN PATENT DOCUMENTS

JP    2000-36533    2/2000

(Continued)

Primary Examiner—Ida M Soward
(74) Attorney, Agent, or Firm—Cooper & Dunham LLP

(57) ABSTRACT

A semiconductor apparatus includes a cell section including at least two transistors. A layer interval insulation coat is formed at least overlying the gate electrode use polysilicon and the gate contact use polysilicon. A source electrode metal coat is formed overlying the semiconductor substrate and insulated from the gate electrode use polysilicon and the gate contact use polysilicon, and is electrically connected to the body diffusion layer and the source diffusion layer. A gate use connection hole is formed on the layer interval insulation coat overlying the gate contact use polysilicon. The gate use connection hole has a width larger than that of the trench. A gate electrode metal coat is formed on the gate use connection hole and the layer interval insulation coat. The polysilicon coat is formed at the same level or lower than the surface of the semiconductor substrate.

8 Claims, 13 Drawing Sheets

U.S. PATENT DOCUMENTS

| | | |
|---|---|---|
| 2009/0020810 A1 * | 1/2009 | Marchant ................ 257/331 |
| 2009/0057756 A1 * | 3/2009 | Hshieh .................. 257/330 |

FOREIGN PATENT DOCUMENTS

| | | |
|---|---|---|
| JP | 2000-183343 | 6/2000 |
| JP | 2003-515915 | 5/2003 |
| JP | 2004-335869 | 11/2004 |
| JP | 2005-268749 | 9/2005 |
| JP | 2006-13487 | 1/2006 |
| JP | 2006-135038 | 5/2006 |

* cited by examiner

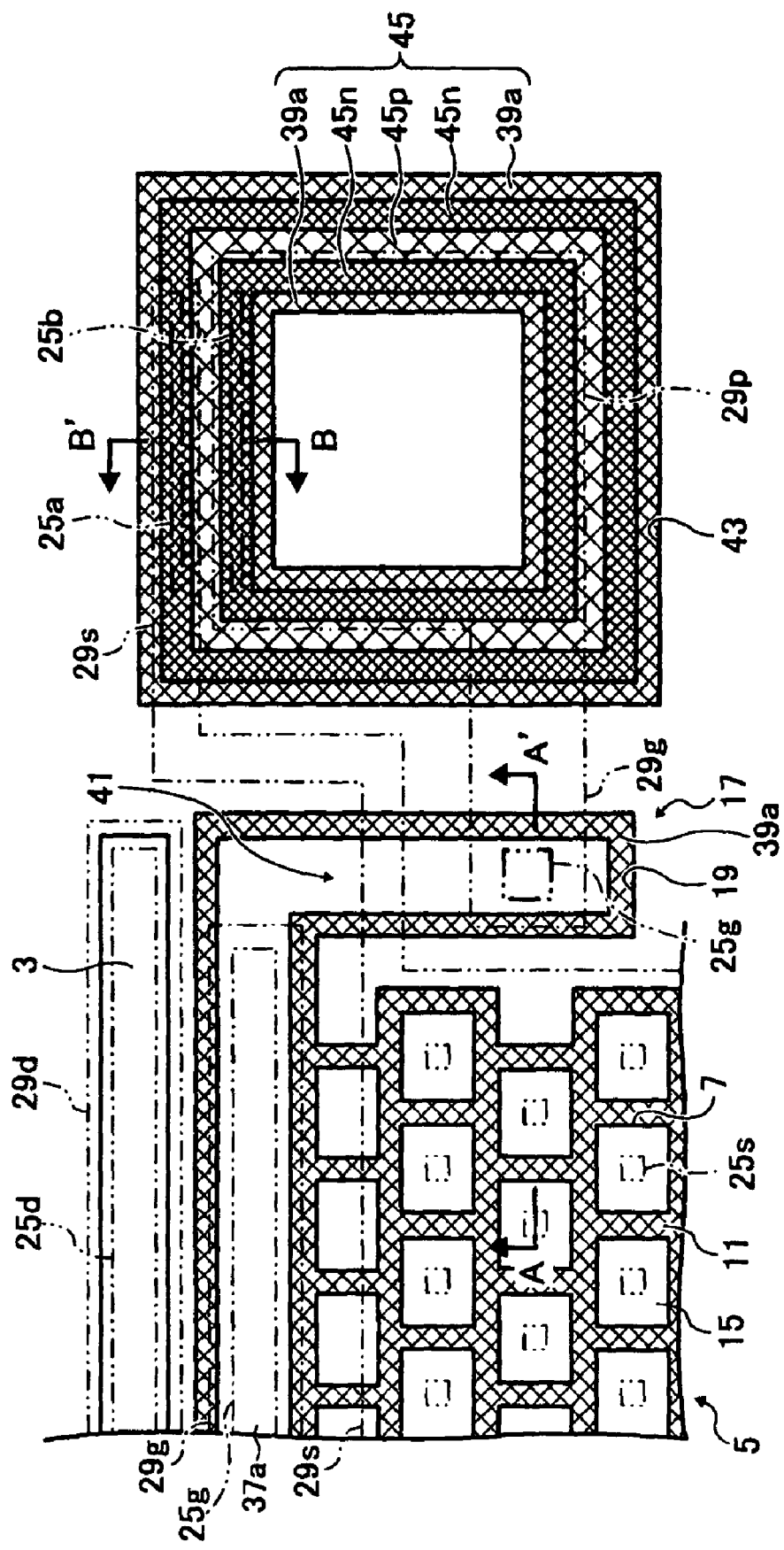

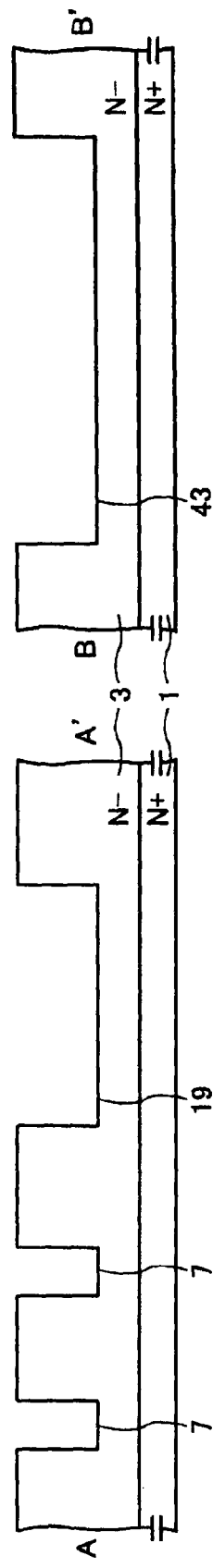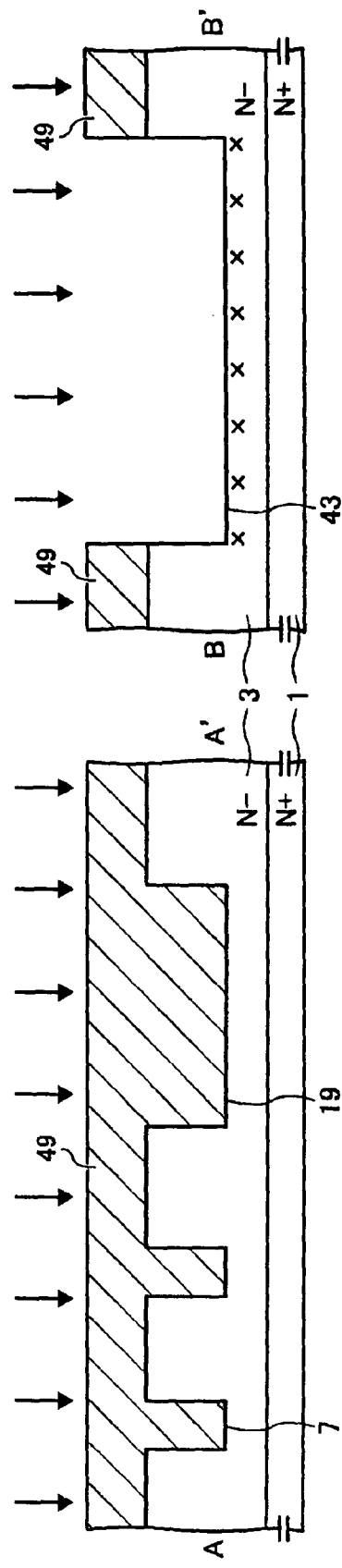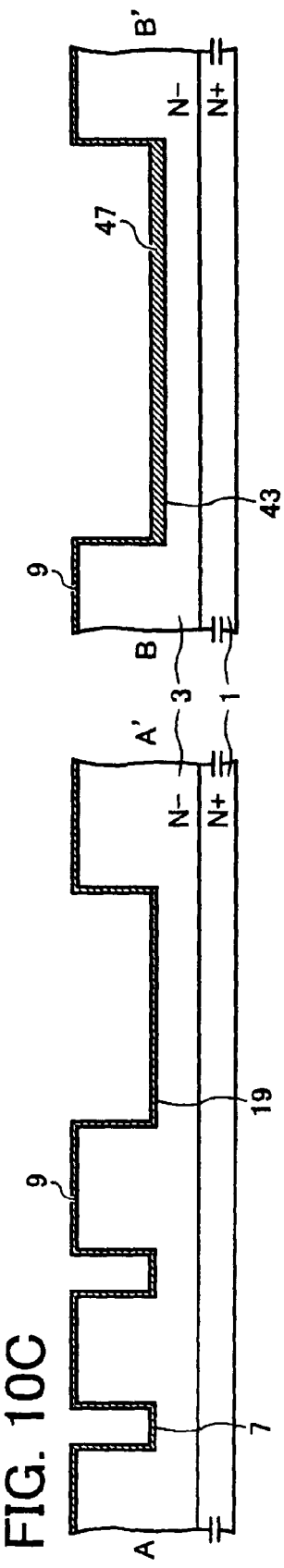

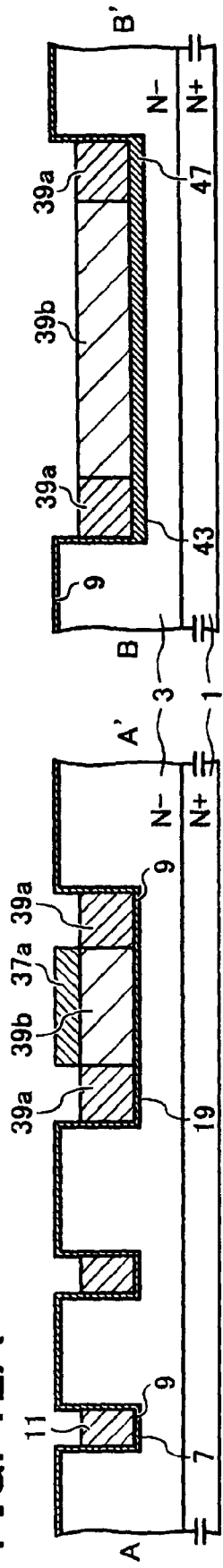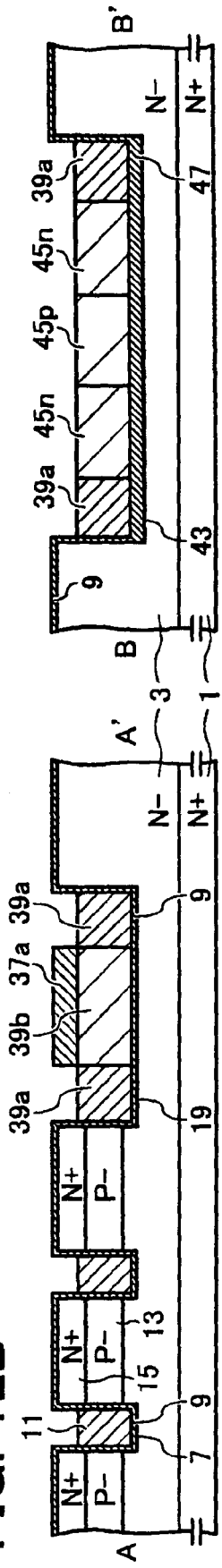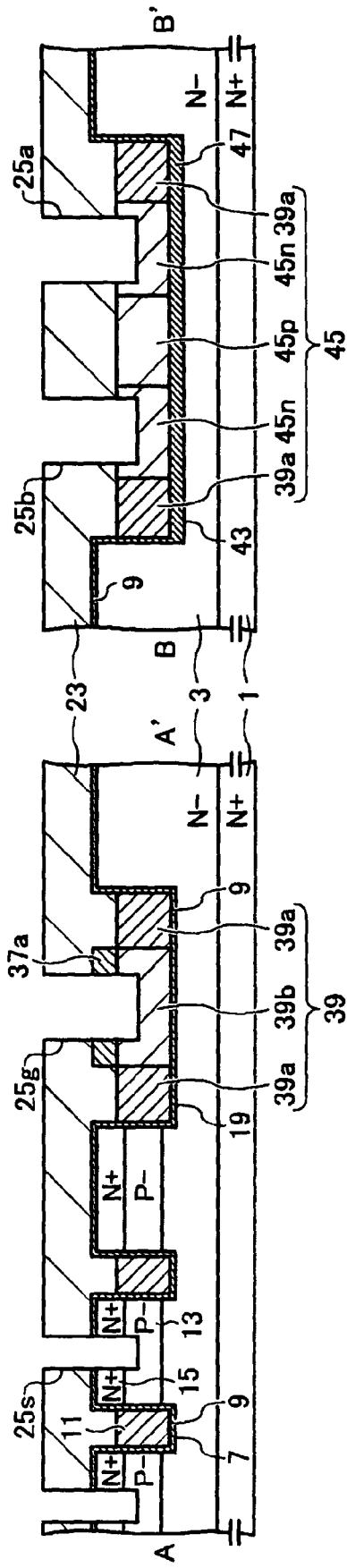

SEMICONDUCTOR APPARATUS AND MANUFACTURING METHOD USING A GATE CONTACT SECTION AVOIDING AN UPWARDLY STEPPED POLYSILICON GATE CONTACT

BACKGROUND OF THE INVENTION

1. Field of the Invention

The present invention relates to a semiconductor apparatus and a semiconductor manufacturing method, and in particular, to a semiconductor apparatus including a gate electrode use polysilicon formed in a trench (i.e., a groove) formed on the surface of the semiconductor substrate via a gate insulation layer and a method for manufacturing the semiconductor apparatus. As such a transistor, a trench type power MOSFET (an Insulation gate type electrical field effect transistor) and an IGBT (an insulation gate type bipolar transistor) are exemplified.

2. Discussion of the Background Art

In general, a vertical type MOSFET is used for a power device such as a power MOSFET, etc. The power MOSFET includes a configuration in that a gate electrode made of polysilicon is formed in a trench as a mainstream. Further, together with the power MOSFET, a gate-source interval protection zener diode (a protection element) and an ESD (Electro Static Discharge) countermeasure use gate protection resistance element and so on are sometimes formed in another region of the same semiconductor substrate. These elements are frequently formed on a polysilicon coat, such as an element separation coat, formed overlying the semiconductor substrate. Thus, a process for forming the polysilicon coat is needed in the power MOSFET.

FIG. 13A is a plan view of a conventional power MOSFET, and FIG. 13B is a cross sectional view illustrating the conventional power MOSFET when viewed from a section along with an extension line X-X' drawn in FIG. 13A. As shown, a N-type epitaxial layer 3 is formed by means of epitaxial growth on a surface of an N-type mono-crystal silicon substrate 1. A trench 7 is formed on a N-type epitaxial layer 3. A gate insulation coat 9 is formed on an inner wall of the trench 7.

In the trench 7, a gate electrode use polysilicon 11 is formed via a gate insulation coat 9. A portion of the gate electrode use polysilicon 11 is drawn from the trench 7 onto the epitaxial layer 3, and is used as a gate contact section 11a. The gate electrode use polysilicon drawn to the epitaxial layer 3 is also utilized as a Gate-source interval protection zener diode or an ESD countermeasure use gate protection resistance element.

A P-type body diffusion layer 13 is formed adjacent to the trench 7 on the surface of the N-type epitaxial layer 3. An N-type source diffusion layer 15 is formed adjacent to the trench 7 on the surface of the P-type body diffusion layer 13. A layer interval insulation coat 23 is formed all over the n-type epitaxial layer 3 covering the gate contact section 11a. A source use connection hole 25s is formed on the layer interval insulation coat 23 on the N-type source diffusion layer 15 and reaches the N-type source diffusion layer 15 and the P-type body diffusion layer 13. A gate use connection hole 25g is formed on the layer interval insulation coat 23 on the gate contact section 11a and reaches the gate contact section 11a. A conductive plug 27 is embedded into each of the connection holes 25g and 25a. A source electrode metal coat 29s is formed on the conductive plugs 27 in the source use connection hole 25s and the layer interval insulation coat 23. A gate electrode metal coat 29g is formed on the conductive plug 27 in the gate use connection hole 29g and the layer interval insulation coat 23. Such a MOSFET is discussed in the Japanese Patent Application Laid Open No. 2006-013487 and a registered U.S. Pat. No. 3,497,751.

In the MOSFET of FIG. 13, due to embedding a polysilicon into a trench 7, a width of the trench cannot be increased and thereby limited to a prescribed level. When embedding the polysilicon into the trench 7, the polysilicon needs a coat thickness more than half of the trench width. Accordingly, a thicker coat needs to be formed. Specifically, when a portion of the polysilicon coat is left on the silicon substrate like the gate contact section 11a of FIG. 13, for example, resolution deteriorates in the following process of a photoengraving due to a step created on the polysilicon. Further, due to a step of the polysilicon as shown in FIG. 13, a residue 53 appears when a metal wiring patterning is executed. Since downsizing and low pricing are demanded in the future, and accordingly, a resistance increases as a result of the downsizing of a diameter of a contact, it is demanded to keep a sufficient contact area. Thus, a cheep process going with a simple flow is expected while suppressing a step as far as possible on the semiconductor substrate surface.

Further, as a manner of embedding a gate electrode used polysilicon in the trench and forming and connecting a contact, the below described manners have been proposed in a power device. For example, as shown in the JP Application Publication No. 2006-135038, a zener diode or a resistance element is formed from a second polysilicon coat, separately formed from a gate electrode use polysilicon on an element separation coat overlying the silicon substrate. Further, the second polysilicon coat is also formed on a gate contact section of the gate electrode.

However, formation of the second polysilicon coat necessarily increases a number of processes. In addition, a step appears due to the second polysilicon coat, and likely causes a metal wiring residue during patterning of a metal wiring after a layer interval coat is formed. Further, when a fining technologynology is innovated and an interval between a trench-gate electrode and a gate contact section is shortened, an uneven thickness appears in the layer interval insulation coat in the vicinity of a step due to the step created by a second polysilicon coat covering a gate contact section. As a result, a contact depth of the trench section varies, and a performance of the transistor varies. Further, in a photo engraving process for forming a contact, a resist coat thickness varies, and the unevenness causes an uneven diameter of a connection hole and contact resistance. Further, a contact hole formed on the gate contact section of the gate electrode use polysilicon embedded in the trench is small so that a contact resistance increases. Due to a need of embedding a polysilicon into a trench, a trench width has its own limit as long as the above-mentioned embedding manner is used. Accordingly, a diameter of a connection hole is limited to a prescribed level. As a result, it is impossible to form a connection hole of a large diameter capable of flowing more amount of current while decreasing a resistance.

Further, as discussed in the Japanese Patent Application publication No. 2003-515915, a gate contact section of a gate electrode use polysilicon is formed on each of a connection trench, formed by extending a gate trench, and a sidewall made of a gate electrode use polysilicon of an terminal end. However, a diameter of a connection hole formed on each of the trench and the sidewall is small, and a contact resistance increases. Further, due to a need of embedding a polysilicon into a trench, a trench width has its own limit as long as the above-mentioned embedding manner is used. Accordingly, a diameter of a connection hole is limited to a prescribed level.

As a result, it is impossible to form the connection hole with a large diameter capable of flowing more amount of current while decreasing a resistance.

SUMMARY OF THE INVENTION

Accordingly, an object of the present invention is to improve such background art technologies and provides a new and novel semiconductor apparatus. Such a new and novel semiconductor apparatus comprises a cell section including at least two transistors. The cell section includes a drain layer having a semiconductor substrate, a trench formed on the surface of the semiconductor substrate with a depth reaching the drain layer, and a gate electrode use polysilicon formed in the trench via a gate insulation coat, a body diffusion layer formed overlying the semiconductor substrate and neighboring the trench and shallower than the trench. A source diffusion layer is formed in the cell section overlying the semiconductor substrate and neighboring the trench and the body diffusion layer. The source diffusion layer is shallower than the body diffusion layer. A gate contact section is provided and includes a gate contact use concave section formed overlying the semiconductor substrate while being separated from the cell section in succession with the trench. The gate contact use concave section has a larger width than that of the trench. A gate contact use polysilicon is arranged in the gate contact use concave section via an insulation coat and electrically connected to the gate electrode use polysilicon. A layer interval insulation coat is formed at least overlying the gate electrode use polysilicon and the gate contact use polysilicon. A source electrode metal coat is also formed overlying the semiconductor substrate, being insulated from the gate electrode use polysilicon and the gate contact use polysilicon while being electrically connected to the body diffusion layer and the source diffusion layer. A gate use connection hole is formed on the layer interval insulation coat overlying the gate contact use polysilicon. The gate use connection hole has a width larger than that of the trench. A gate electrode metal coat is formed on the gate use connection hole and the layer interval insulation coat. The polysilicon coat is formed at the same level or lower than the surface of the semiconductor substrate.

In another embodiment, the upper surfaces of the gate electrode use polysilicon and the gate contact use polysilicon are lower than the surface of the semiconductor substrate. A silicon oxide coat is formed between the gate contact use polysilicon and the layer interval insulation coat and is separated with an interval from a sidewall of the gate contact use concave section. The upper surface of the silicon oxide coat is the same level with the surface of the semiconductor substrate.

In yet another embodiment, a protection element use concave section is formed on the surface of the semiconductor substrate with a larger width than that of the trench. A protection element has a PN diode formed from a protection element use polysilicon. The PN diode is formed in the protection element use concave section via an insulation coat. The layer interval insulation coat is also formed on the protection element use polysilicon. The protection element use polysilicon is electrically connected between the source electrode metal coat and the gate electrode metal coat.

In yet another embodiment, the insulation coat is formed on the bottom surface of the protection element use concave section is thicker than the gate insulation coat.

In yet another embodiment, the upper surfaces of the gate electrode use polysilicon, the gate contact use polysilicon, and the protection element use concave section are lower than the surface of the semiconductor substrate. A silicon oxide coat is formed between the gate contact use polysilicon and the layer interval insulation coat and is separate with an interval from a sidewall of the gate contact use concave section. The upper surface of the silicon oxide coat is the same level with the surface of the semiconductor substrate. The silicon oxide coat is excluded between the protection element use polysilicon and the layer interval insulation coat.

In yet another embodiment, a resistance element use concave section is formed on the surface of the semiconductor substrate with a larger width than that of the trench. A resistance element use polysilicon is arranged in the resistance element use concave section via an insulation coat. The layer interval insulation coat is also formed overlying the resistance element use polysilicon.

In yet another embodiment, a resistance of the resistance element use polysilicon is determined by a length and a width of the resistance element use concave section as well as a coat thickness of the resistance element use polysilicon.

In yet another embodiment, a resistance of the resistance element use polysilicon is determined by density of impurity introduced to the resistance element use polysilicon.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein:

FIG. 8A is a plan view illustrating an exemplary semiconductor apparatus according to still another embodiment of the present invention;

FIGS. 10A to 10C are cross sectional views illustrating an initial stage of exemplary processes according to still another embodiment of the present invention;

FIGS. 12A to 12C are cross sectional view illustrating further subsequent processes of the above-mentioned subsequent processes;

DETAILED DESCRIPTION OF THE PREFERRED EMBODIMENTS

Figure 1A:
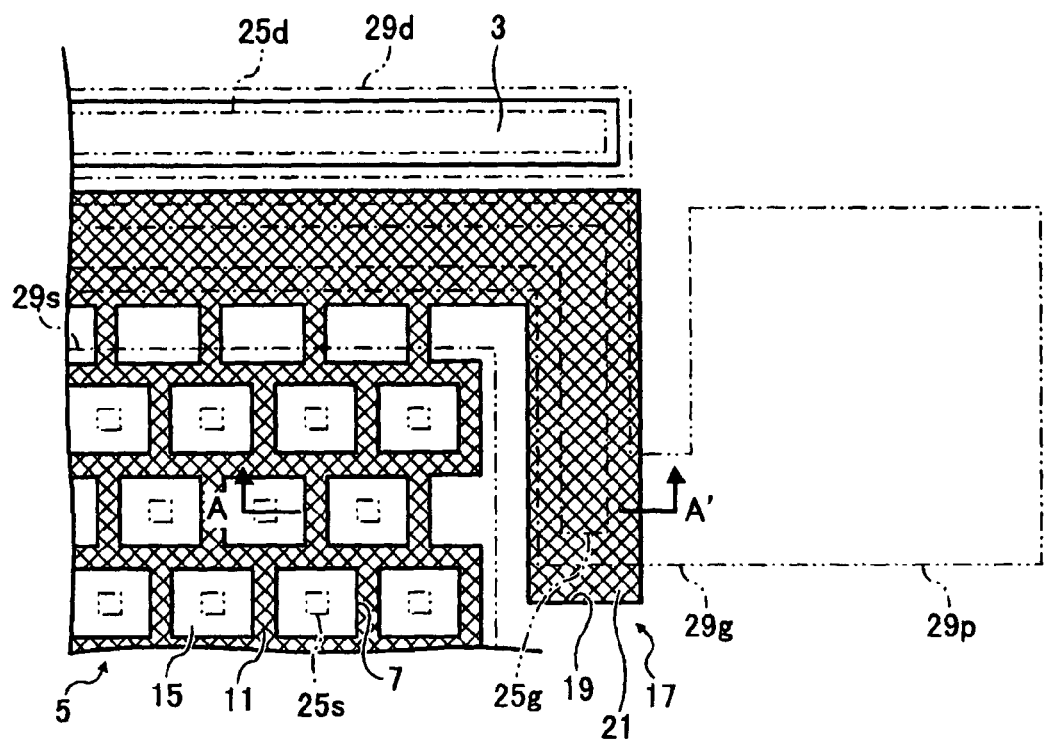
FIG. 1A is a plan view illustrating an exemplary semiconductor apparatus according to one embodiment of the present invention.
Figure 1B:
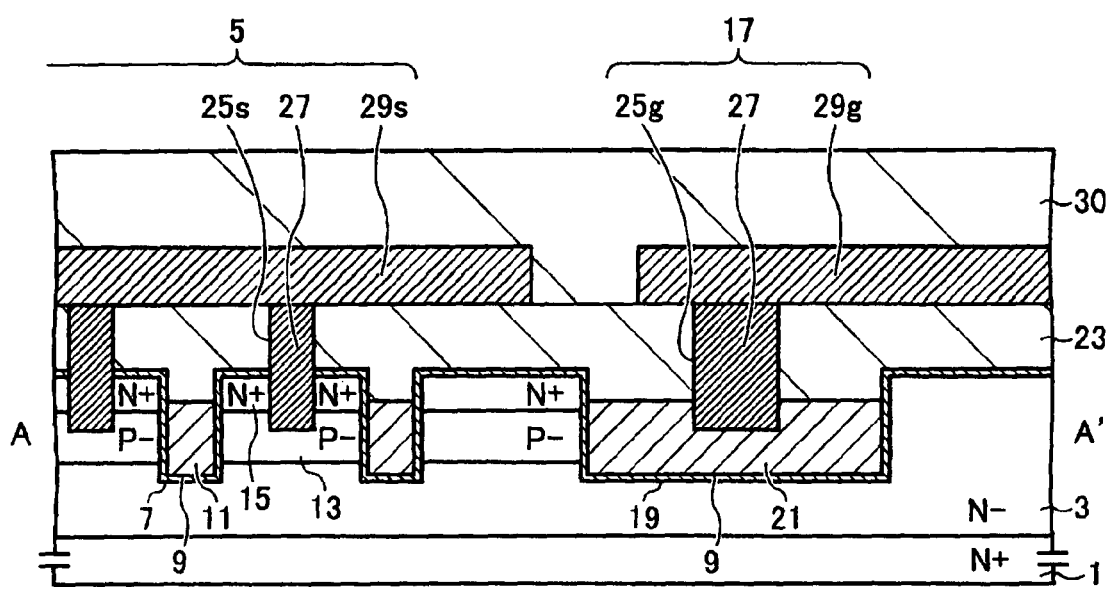
FIG. 1B is a cross sectional view illustrating the exemplary semiconductor apparatus of FIG. 1A when viewed from a section along with an extension line A-A' as drawn in FIG. 1A.

Referring now to the drawing, wherein like reference numerals designate identical or corresponding parts throughout several views, in particular in FIG. 1A, an exemplary semiconductor apparatus is illustrated according to one embodiment of the present invention. FIG. 1B illustrates the exemplary semiconductor apparatus of FIG. 1A when viewed from a section along with an extension line A-A' as drawn in FIG. 1A. In the following embodiments, a MOSFET with a single metal wiring structure is employed as one example. However, the present invention can be applied to a multiple layer metal wiring structure. Now, an exemplary embodiment is described with reference to FIGS. 1A and 1B.

An N-type epitaxial layer (N−) 3 created by means of epitaxial growth is formed on the surface of an N-type monocrystal silicon substrate (N+) 1. For example, the N-type monocrystal silicon substrate 1 includes a resistance of $6.0 \times 10^{-3} \Omega \cdot cm$, and a thickness of 625 micrometer. The N-type epitaxial layer 3 includes a resistance of $0.2\Omega \cdot cm$ and a thickness of 4.0 to 5.0 micrometer. These N-type monocrystal silicon substrate 1 and N-type epitaxial layer 3 collectively form a semiconductor substrate.

These N-type monocrystal silicon substrate 1 and N-type epitaxial layer 3 serve as a drain layer.

In a cell section 5 forming a transistor, a trench 7 is formed on the surface of the N-type epitaxial layer 3 opposite to the N-type monocrystal silicon substrate 1. As shown in FIG. 1A, the trench 7 is formed such that the surface of the N-type epitaxial layer 3 is divided and staggered in a land shape. For example, a width and a depth of the trench 7 are 0.5 micrometer and 1.5 micrometer, respectively.

A gate insulation coat 9 (not shown in FIG. 1A) formed from a silicon oxide coat, for example, is formed on an inner wall of the trench 7. A thickness of the silicon oxide coat forming the gate insulation coat 9 is 25 nm (nanometer), for example. A gate electrode use polysilicon 11 made of polysilicon is arranged in the trench 7 via a gate insulation coat 9. The upper surface of the gate electrode use polysilicon 11 is formed being dropped from the surface of the N-type epitaxial layer 3 in the trench 7. A depth of a recess (i.e., an etching depth from the surface of the N-type epitaxial layer 3) is 0.5 micrometer, for example.

A P-type body diffusion layer (P−) 13 is formed on the surface of the N-type epitaxial layer 3 adjacent to the trench 7. The P-type source body diffusion layer 13 is formed shallower than the trench 7. A depth of the P-type body diffusion layer 13 is 1.1 micrometer, for example. An N-type diffusion layer 15 is formed on the surface of the N-type epitaxial layer 3 adjacent to the trench 7. A depth of the N-type source diffusion layer 15 needs to be shallower than the P-type body diffusion layer 13 and deeper than the recess to be 0.5 micrometer, for example.

A gate contact use concave section 19 is formed in a belt state on the surface of the N-type epitaxial layer 3 in the gate contact section 17 at a different position from the cell section 5. The gate contact use concave section 19 is formed in succession to the trench 7. A width of the gate contact use concave section 19 is larger than that of the trench 7 to be 6.0 micrometer, for example. Further, a depth of the gate contact use concave section 19 is 1.5 micrometer, for example.

A gate contact use polysilicon 21 made of polysilicon is arranged in a gate contact use concave section 19 via the gate insulation coat 9. The gate contact use polysilicon 21 is electrically connected to the gate electrode use polysilicon 11. The upper surface of the gate contact use polysilicon 21 is formed being dropped from the surface of the N-type epitaxial layer 3 in the trench 7. A recess depth is 0.5 micrometer, for example.

A layer interval insulation coat 23 (not shown in FIG. 1A) is formed on the N-type epitaxial layer 3 while covering the cell section 5 and the gate contact section 17. Further, a polysilicon coat is not formed upper than the surface of the N-type epitaxial layer 3.

A gate use connection hole 25g is formed on the layer interval insulation coat 23 on the gate contact use polysilicon 21. The gate use connection hole 25g is formed in a belt state on the gate contact use polysilicon 21. A width of the gate use connection hole 25g is larger than that of the trench 7 to be 1.0 micrometer, for example.

A source use connection hole 25s is formed on a layer interval insulation coat of the N-type source diffusion layer 15 and the gate insulation coat 9. The source use connection hole 25s penetrates the N-type source diffusion layer 15, and has a depth reaching a P-type body region 13. A drain use connection hole 25d is formed on the layer interval insulation coat 23 and the gate insulation coat 9 at a different position from the cell section 5 and the gate contact section 9. A conductive plug 27 made of such as Tungsten is embedded in the connection holes 25g, 25s and 25d, for example.

A gate electrode metal coat 29g is formed on the gate use connection hole 25g and the layer interval insulation coat 23. A portion of the gate electrode metal coat 25g forms a gate electrode pad 29p. A source electrode metal coat 29s is formed on the source use connection hole 25s and the layer interval insulation coat 23. A portion of the source electrode metal coat 29s forms a source electrode pad. A drain electrode metal coat 29d is formed on the drain use connection hole 25d and the layer interval insulation coat 23. Although not illustrated in the drawings, a potential of a drain layer is provided via a metal coat (not shown) arranged on the rear side of the silicon substrate 1.

A passivation coat 30 is formed on the layer interval insulation coat 23 while including the metal coats 29g, 29s and 29d (not shown in FIG. 1A). The passivation coat 30 is removed from the gate electrode pad 29p and the source electrode pad, so that respective pad openings (not shown) are formed.

In this example, since a polysilicon coat is not formed upper than the surface of the N-type epitaxial layer 3, a step is not created on the surface of the semiconductor substrate due to the polysilicon coat. Thus, the upper surface of the layer interval insulation coat 23 can be flat, thereby deterioration of photoengraving resolution can be suppressed when a patterning in relation to metal coats 29g, 29s, and 29d is executed. As a result, metal residue can be suppressed. Further, since the gate use connection hole 25g has a wider width than that of the trench 7, a low contact resistance can be obtained at a gate contact section 9 for taking in a potential of the gate electrode use polysilicon 21, even if a width of the trench of the cell section 5 decreases as an semiconductor apparatus becomes fine.

FIGS. 2A to 3C are exemplary cross sectional views illustrating exemplary manufacturing processes for manufacturing a semiconductor apparatus. FIG. 4 is a cross sectional view illustrating an exemplary enlarged contact concave section in one of processes according to one embodiment of the present invention. Now, an exemplary manufacturing method is described with reference to FIGS. 1A to 4.

Figure 2A:
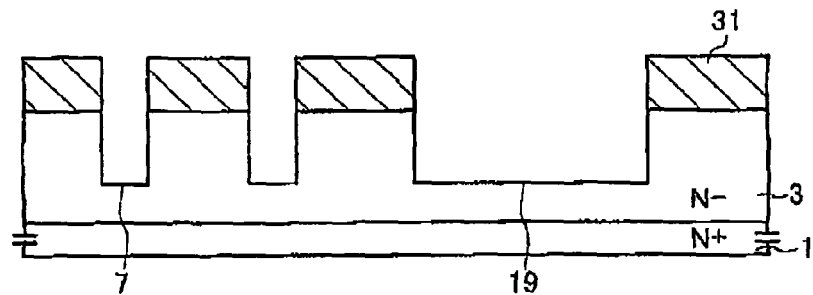
FIGS. 2A to 2D are cross sectional views illustrating an initial stage of exemplary processes of executing a manufacturing method according to one embodiment of the present invention.

As shown in FIG. 2A, an N-type epitaxial layer 3 having a thickness of 4.0~5.0 micrometer and a resistance of $0.2\Omega\cdot cm$, for example, is formed on a N-type monocrystal silicon substrate 1 having a thickness of 625 micrometer and a resistance of $6.0 \times 10^{-3} \Omega\cdot cm$. A thick silicon oxide coat 31 is formed on the N-type epitaxial layer 3, for example, using a LPCVD (Low Pressure Chemical Vapor Deposition). Using a photo engraving technology and an etching technology, the silicon oxide coat 31 undergoes etching removal from a formation-scheduled region in the trench and the gate contact use concave section. By using a reactive ion etching apparatus with a magnetic assist while masking the silicon oxide coat 31, for example, an etching processing is executed for 100 second under conditions that a mixture gas includes 25 sccm of HBr, 20 sccm of NF3, and 2.6 sccm of $O_2$, a RF power is 650 W, and a pressure is 80 mT. As a result, a trench having a depth of about 1.5 micrometer and a gate contact use concave section 19 are formed.

Figure 2B:
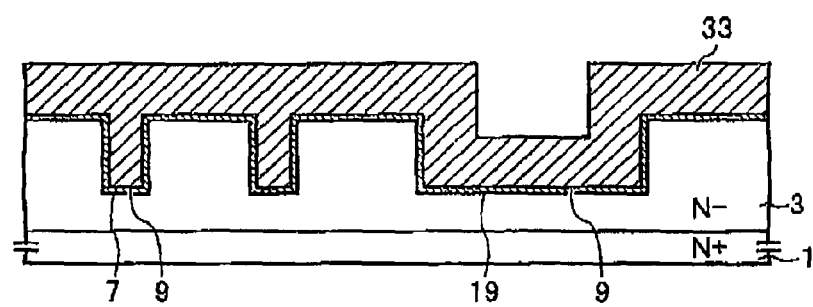

As shown in FIG. 2B, the silicon oxide coat 31 used as a mask is removed by means of wet etching. By applying a heat oxidation, a gate insulation coat 9 formed from a silicon oxide coat is formed on an inner wall of the gate contact use concave section 19 and the trench 7 as well as the surface of the N-type epitaxial layer 3 with a thickness of about 25 nm, for example. Using a CVD method, for example, in temperature of 550 degrees centigrade while adding $PH_3$, a polysilicon coat 33 is formed with a thickness of about 1.0 micrometer. The trench 7 having the width of 0.5 micrometer is completely embedded, and the surface of the polysilicon coat 33 is almost flat on the trench 7. However, the gate contact use concave section 19 with a width of 6.0 micrometer is not completely embedded, and a concave section 33a is created on the surface of the polysilicon coat 33 and the gate contact use concave section 19.

Figure 2C:
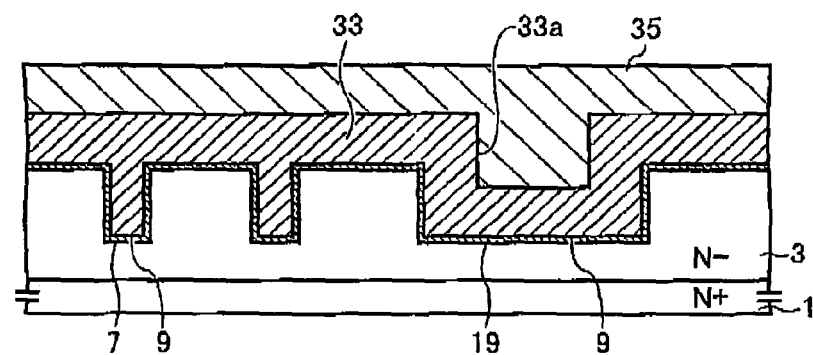
Figure 2D:
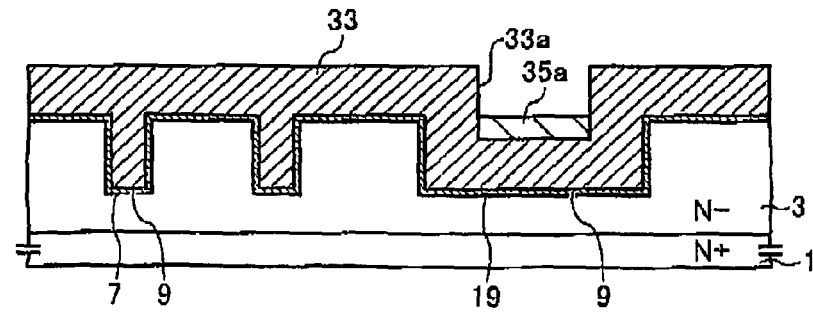

As shown in FIG. 2C, a photo resist 35 is formed with a thickness of 2.0 micrometer on the polysilicon coat 33a, for example. As shown in FIG. 2D, using a micro wave plasma etching apparatus, for example, an etching back processing is applied to the photo resist 35 under conditions that a microwave power is 400 W, a mixture gas includes 30 sccm of $Cl_2$, 20 sccm of $O_2$, 130 sccm of Ar, a pressure is 1.2 Pa, and a RF power is 20 W. Specifically, the photo resist 35a (a mask use insulation coat) is left only in the concave section 33a. At this moment, the photo resist 35a is formed with a coat thickness and a recess amount of 0.5 micrometer.

Figure 3A:
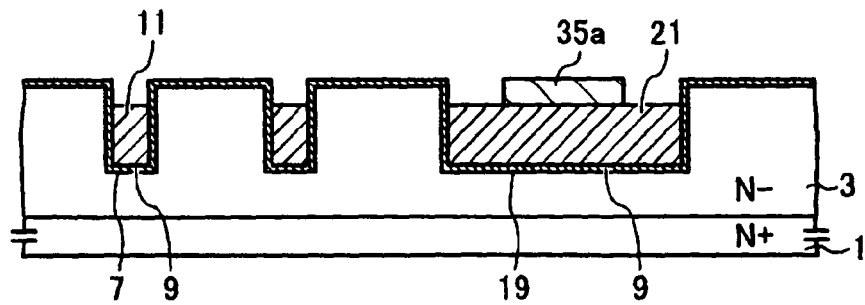
FIGS. 3A to 3C are cross sectional views illustrating the subsequent processes of the above-mentioned initial stage of exemplary processes.
Figure 4:
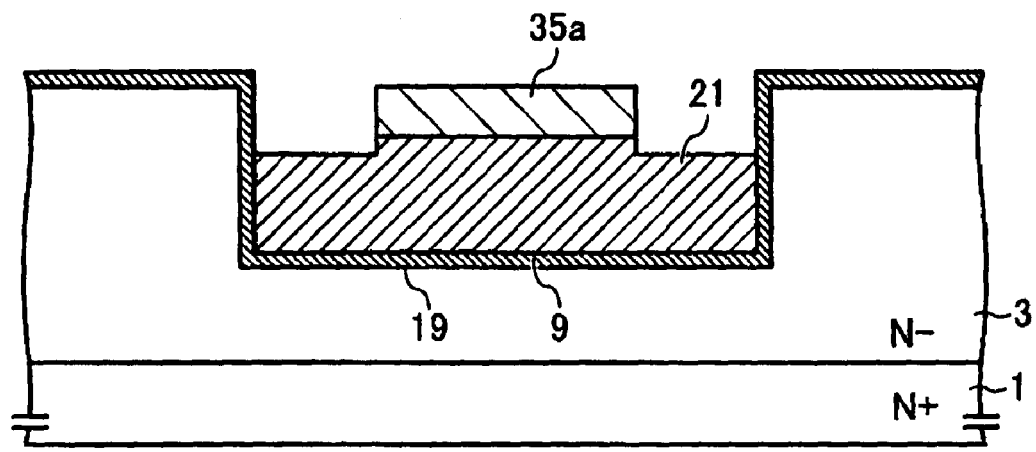
FIG. 4 illustrates an enlarged cross sectional view illustrating an exemplary condition of a concave section of a contact in one of the processes executing the above-mentioned method.

As shown in FIG. 3A, using a micro wave plasma etching apparatus, for example, an etching back processing such as anisotropic etching, is applied to the polysilicon coat 33 while masking the photo resist 35a under conditions that a micro wave power is 400 W, a mixture gas includes 45 sccm of $Cl_2$, 75 sccm of HBr, and 3 sccm of $O_2$, a pressure is 0.5 Pa, and a RF power is 30 W. Thereby, the polysilicon coat 33 is processed to have a prescribed recess amount of 0.5 micrometer, and a gate electrode use polysilicon 11 is formed in the trench 7, while the gate contact use polysilicon 21 is formed in the gate contact use concave section 19. Since the polysilicon coat 33 beneath the photo resist 35a is not etched at that moment, and is formed with a thickness (1.0 micrometer) calculated by subtracting the recess amount (0.5 micrometer) from the depth of the contact concave section (1.5 micrometer), the upper surface of the gate contact use polysilicon 21 is formed being flat. However, as shown in FIG. 4, due to uneven thickness of the polysilicon coat 33 appearing during its formation as well as uneven etching caused during recess amount adjustment, a small step can sometimes be created on the upper surface of the gate contact use polysilicon 21.

Figure 3B:
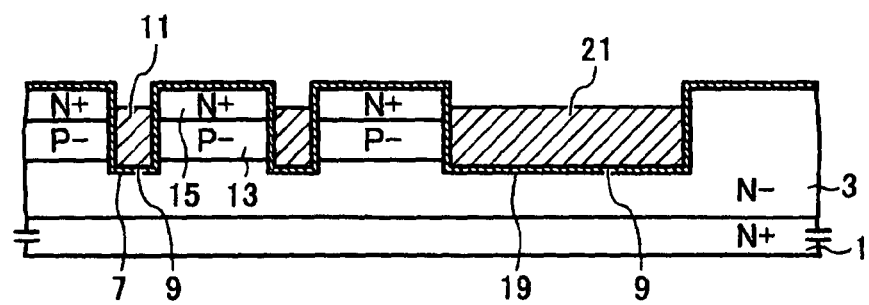

As shown in FIG. 3B, the photo resist 35a is removed. By using a photo engraving technology and an ion injection technology, a P-type body diffusion layer 13 and a N-type source diffusion layer 15 are formed on the N-type epitaxial layer 3 in the cell section 5.

Figure 3C:
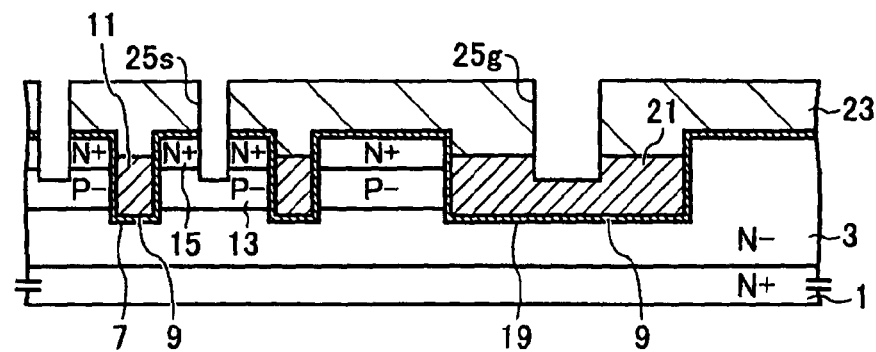

As shown in FIG. 3C, using a CVD method, a layer insulation coat 23, such as a laminated coat formed from NSG (Non-dope Silicon Glass) and BPSG (Boro-Phospho Silicate Glass) coats, is formed all over the surface of the N-type epitaxial layer 3 by including the cell section 5 and the gate contact section 17 with a thickness of about 800 nm. Since the polysilicon coat is not formed upper than the surface of the N-type epitaxial layer 3, a step is not created on the surface of the N-type epitaxial layer 3 due to the polysilicon coat. As a result, a flat upper surface is formed on the layer interval insulation coat 23. The connection holes 25g, 25s, and 25d are formed using a photo engraving or etching technologies as also illustrated in FIGS. 1A and 1B. These holes can be separately or simultaneously formed. A width of the gate use connection hole 25g is larger than that of the trench 7 to be 1.0-micron meter, for example. Thus, a low resistance can be obtained at the gate contact section 9 to take in a potential for the gate electrode use polysilicon 21.

As shown in FIG. 1B, a plurality of conductive plugs 27 are formed in the connection holes 25g, 25s, and 25d, respectively, by depositing a conductive coat, such as Tungsten, etc., by means of the CVD method, white applying etching back to the conductive coat. Using a spatter method, a metal coat made of alumimum, such as AlSi, AlSiCu, etc., is deposited, for example. By applying patterning to the aluminum metal coat, electrode coats 29g, 29s and 29d are formed. Since the upper surface of the layer interval insulation coat 23 is made flat, deterioration of a photo engraving resolution can be suppressed when the patterning is applied to the electrode coats 29g, 29s and 29d, and production of metal residue can also be suppressed. Then, a passivation coat 30 and a pad-opening section are formed as also illustrated in FIGS. 1A and 1B.

In this embodiment, an etching back process, such as anisotropy etching, is applied to the polysilicon coat 33 in the above-mentioned process as shown in FIGS. 3A to 3C. The etching back process of the anisotropy etching can employ a CDE (Chemical Dry Etching) apparatus, for example. For example, when the etching back process is implemented under conditions that a microwave power is 600 W, a pressure is 90 Pa, a mixture gas includes CF4/$O_2$ of 400/100 sccm, the step can be smoothed even though a step is created due to uneven etching caused during recess amount adjustment and uneven formation of the polysilicon coat 33. Thus, the upper surface of the gate contact use polysilicon 21 can be made more flat.

Figure 6A:
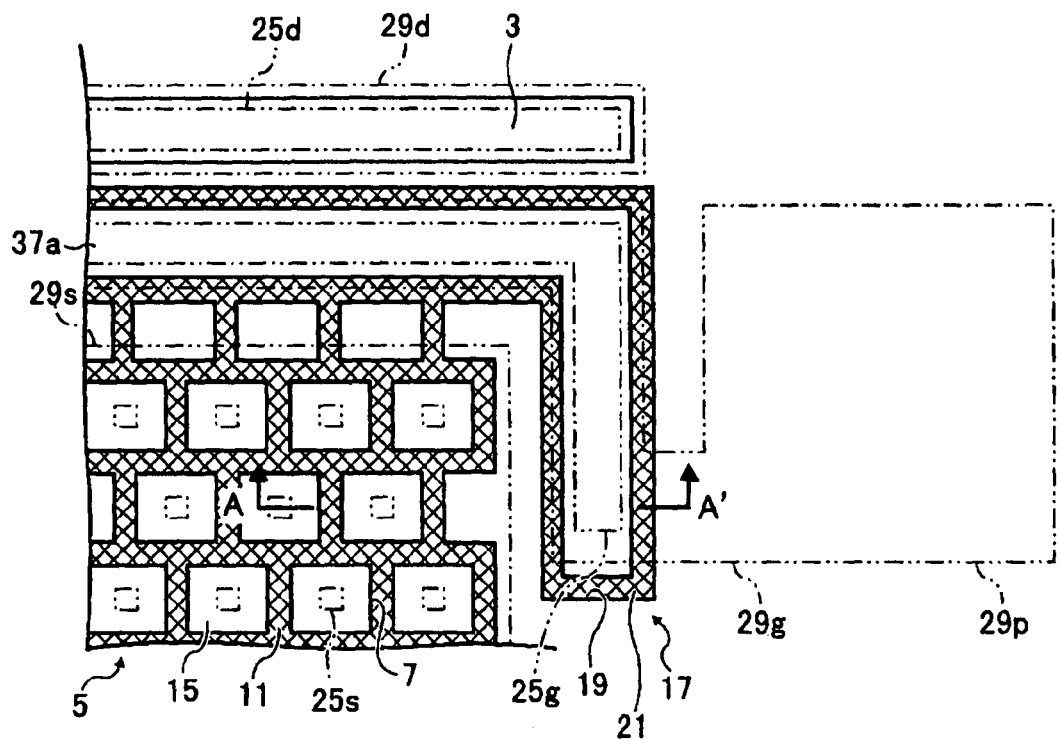
FIG. 6A is a plan view illustrating an exemplary semiconductor apparatus according to still another embodiment of the present invention.
Figure 6B:
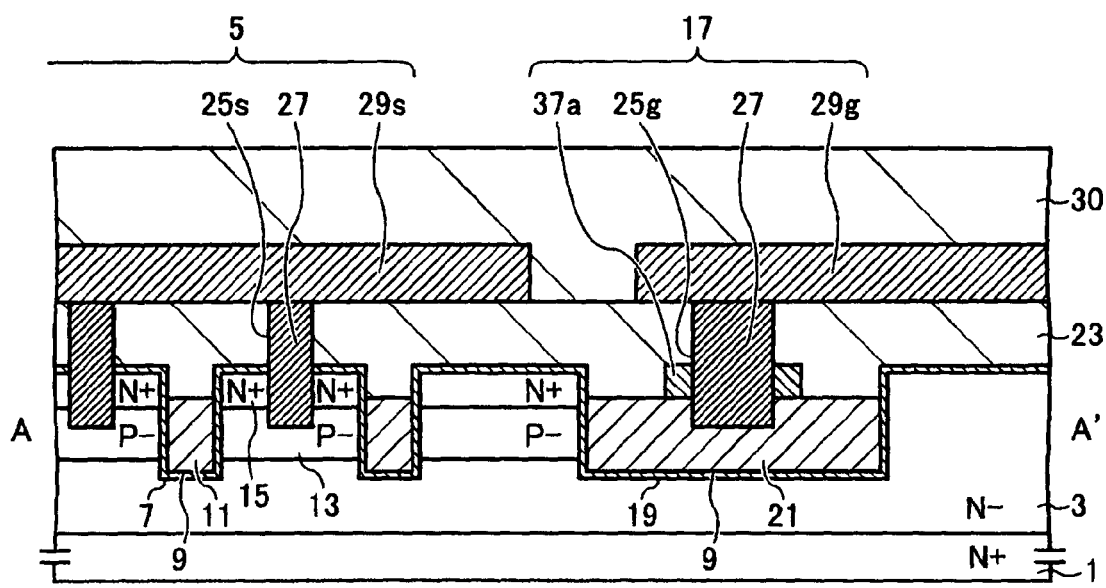
FIG. 6B is a cross sectional view illustrating the exemplary semiconductor apparatus of FIG. 6A when viewed from a section along with an extension line A-A' as drawn in FIG. 6A.

FIG. 6A is a plan view of an exemplary semiconductor apparatus according to another embodiment of the present invention. FIG. 6B is a cross sectional view illustrating the exemplary semiconductor apparatus of FIG. 6A when viewed from a section along with an extension line A-A' as drawn in FIG. 6A. A difference of this embodiment from that of FIGS. 1A and 1B is that a silicon oxide coat 37a is formed between a gate contact use polysilicon 21 and a layer interval insulation coat 23 and separated, with an interval, from a sidewall of a gate contact use concave section 19, with its upper surface being the same level with the surface of a N-type epitaxial layer 3.

FIGS. 7A to 7E are cross sectional views illustrating exemplary process of another embodiment of the manufacturing method according to the present invention. Now, an exemplary manufacturing method is described with reference to FIGS. 6A to 7E.

Figure 7A:
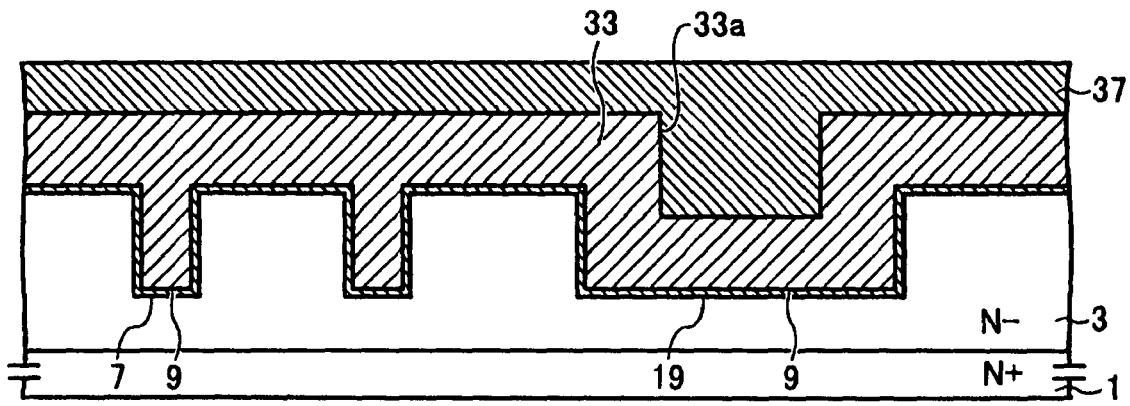
FIGS. 7A to 7E are cross sectional views illustrating exemplary processes in still another embodiment of the manufacturing method.

As shown in FIG. 7A, using the same processes to the above-mentioned processes described with reference to FIGS. 2A and 2B, a polysilicon coat 33 having an N-type epitaxial layer 3, a trench 7, a gate contact use concave section 19, a gate insulation coat 9, and a concave section 33a are formed. On the polysilicon coat 33, a silicon oxide coat 37 is formed including a NSG coat at the lower layer side with a thickness of 400 nm and a SOG (Spin On Glass) coat at the upper layer side with a thickness of 400 nm. The concave section 33a of the polysilicon coat 33 is embedded with the silicon oxide coat 37.

Figure 7B:
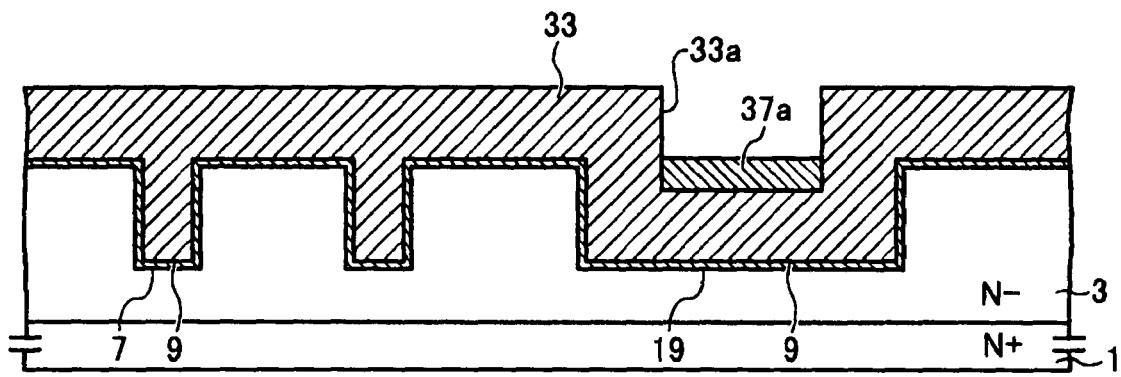

As shown in FIG. 7B, etching back processing is applied to the silicon oxide coat 37, and a silicon coat 37a (mask use insulation coat) remains only in the concave section 33a. At this moment, the silicon oxide coat 37a is formed with a thickness of the recess amount of 0.5 micrometer. The upper surface of the silicon oxide coat 37a coincides with the surface of the N-type epitaxial layer 3. The silicon oxide coat 37a can include the NSG coat only, or a laminate coat including the NSG and SOG coats.

Figure 5:
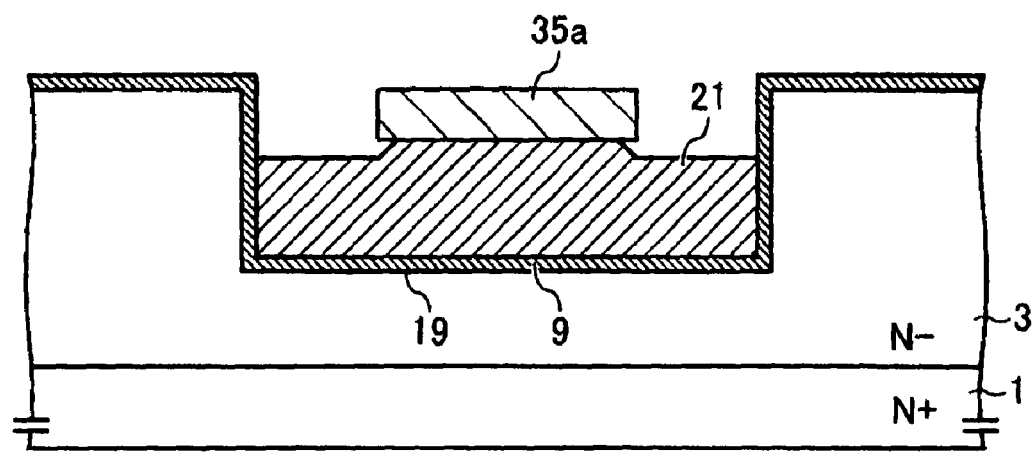
FIG. 5 illustrates an enlarged cross sectional view illustrating an exemplary condition of a concave section in one of processes used in another embodiment of the manufacturing method.
Figure 7C:
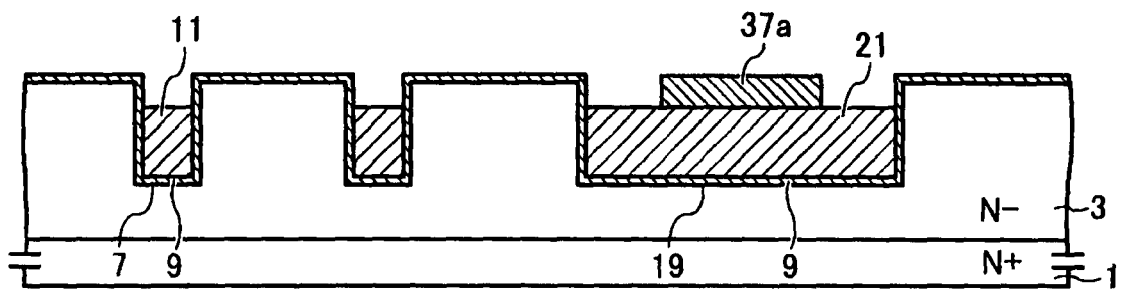

As shown in FIG. 7C, using a micro plasma etching apparatus, for example, etching back processing such as anisotropy etching is applied to a polysilicon coat 33 while masking the silicon oxide coat 37a under conditions that a microwave power is 400W, a mixture gas includes 45 sccm of $Cl_2$, 75 sccm of HBr, and 3 sccm of $O_2$, a pressure is 0.5 Pa, and a RF power is 30 W. Thus, the polysilicon coat 33 is processed to have a prescribed recess amounts to 0.5 micrometer, a gate electrode use polysilicon 11 is formed in the trench 7, and a gate contact use polysilicon 21 is formed in the gate contact use concave section 19. At this moment, since a polysilicon coat 33 beneath the silicon oxide coat 37a is not etched, and the coat is formed with a thickness of 1.0 micrometer as calculated by subtracting the recess amount (0.5 micrometer) from the depth (1.5 micrometer) of the contact concave section 19, the upper surface of the gate contact use polysilicon 21 is formed being flat. However, due to uneven thickness of a coat created during formation of the polysilicon coat 33, and uneven etching caused during recess amount adjustment, a small step is sometimes created on the upper surface of the gate contact use polysilicon 21. Further, similar to that described with reference to FIG. 5, anisotropic etching such as CDE can be executed as etching back processing.

Figure 7D:
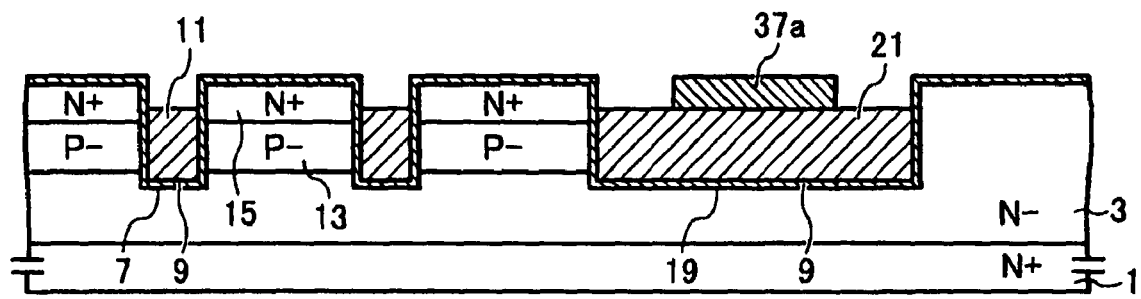

As shown in FIG. 7D, when the silicon oxide coat 37a is not removed and remains, a P-type diffusion layer 13 and an N-type source diffusion layer 15 are formed on the N-type epitaxial layer 3 of the cell section 5 by using a photo engraving technology or an ion injection technology.

Figure 7E:
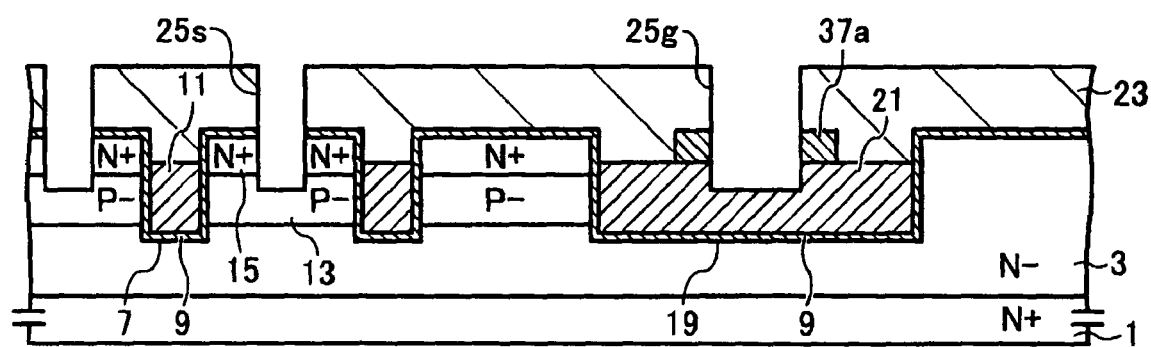

As shown in FIG. 7E, by using the CDE method, a layer interval insulation coat 23 is formed with a thickness of about 800 nm by including a laminate coat formed from NSG and BPSG coats all over the surface of the N-type epitaxial layer 3 including the cell section 5 and the gate contact section 17. Since a polysilicon coat is not formed upper than the surface of the N-type epitaxial layer 3, a step is not created on the surface of the N-type epitaxial layer 3 due to a polysilicon coat 23, thereby the upper surface is made flat on the layer interval insulation coat 23. Further, since the silicon oxide coat 37a is formed on the gate contact use polysilicon 21, flatness of the layer interval insulation coat 23 on the gate contact use polysilicon 21 can be improved. A plurality of connection holes 25g, 25s, and 25d are formed using a photo engraving or etching technology as also illustrated in FIG. 6.

As shown in FIG. 6, using the same processes to those described with reference to FIGS. 1A and 1B, a conductive plug 27, a plurality of electrode coats 29g, 29s, and 29d, a passivation coat 30, and a pad opening section are formed.

Figure 8B:
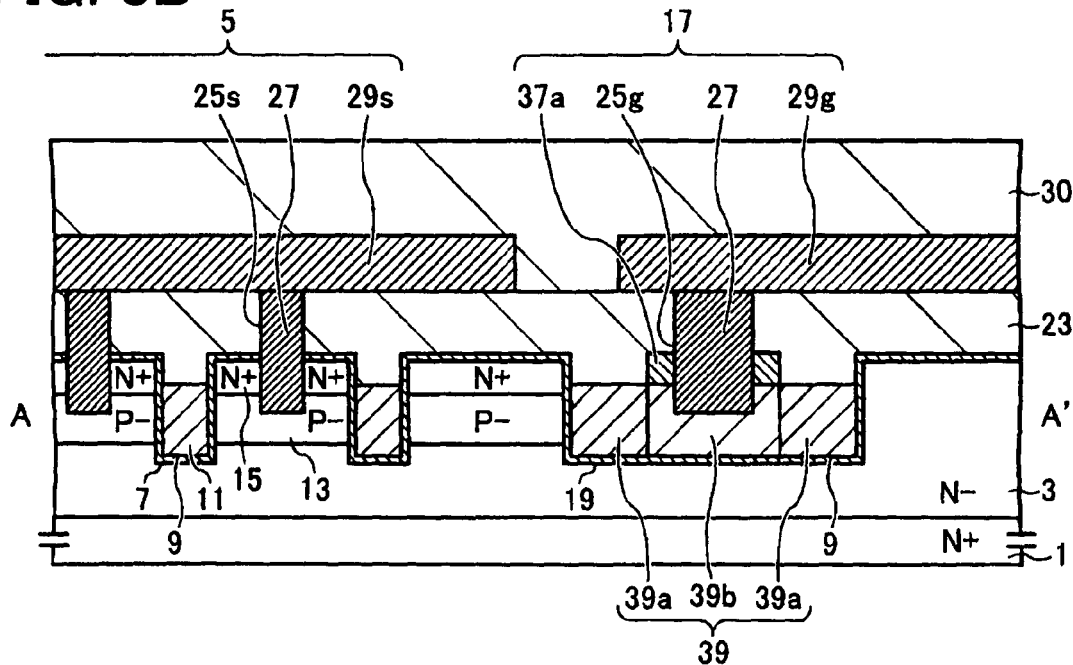
FIG. 8B is a cross sectional view illustrating the exemplary semiconductor apparatus of FIG. 8A when viewed from a section along with an extension line A-A' as drawn in FIG. 8A.
Figure 9:
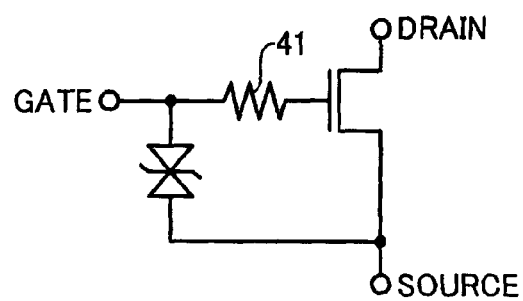
FIG. 9 illustrates an exemplary circuit employed in the above-mentioned embodiments.

FIG. 8A is a plan view of an exemplary semiconductor apparatus according to still another embodiment of the present invention. FIG. 8B is a cross sectional view illustrating the exemplary semiconductor apparatus of FIG. 8A when viewed from a section along with an extension line A-A' as drawn in FIG. 8A. FIG. 9 illustrates an exemplary circuit employed in this embodiment. As shown, a gate contact use polysilicon 39 is formed form a low resistance polysilicon 39a with introduction of impurity and a high resistance polysilicon 39b without introduction of the impurity. A silicon oxide coat 37a is formed between the gate contact use polysilicon 39 and a layer interval insulation coat 23.

A region without formation of a gate electrode metal coat 29g nor the gate use connection hole 25g is formed on the gate contact use polysilicon 39, so that the gate contact use polysilicon 39 within the region constitutes a resistance element 41. The resistance element 41 functions as an ESD countermeasure use gate protection resistance. The resistance element use polysilicon is formed from a portion of the gate contact use polysilicon 39. A resistance element use concave section is formed from a portion of the gate contact use concave section 19. However, the resistance element can be positioned apart from the gate contact use concave section 19.

A frame like protection element use concave section 43 is formed on the surface of a N-type epitaxial layer 3 at a position apart from the cell 5 and the gate contact section 17 with a width larger than that of the trench 7. However, a flat shape of the protection element use concave section 43 is not limited to the frame like. A formation position of the protection element use concave section 43 and that of the gate electrode pad 29p horizontally overlap with each other.

A protection element use polysilicon 45 is arranged in the protection element use concave section 43 via an insulation coat. The protection element use polysilicon 45 includes a frame like low resistance polysilicon 39a, a N-type polysilicon 45n, a P-type polysilicon 45p, a N-type polysilicon 45n, and a low resistance polysilicon 39a. These N-type polysilicon 45n, P-type polysilicon 45p, and N-type polysilicon 45n collectively form a zener diode. An insulation coat 47 formed on the bottom surface of the protection element concave section 43 includes a silicon oxide coat thicker than the gate insulation coat 9.

The outer and inner circumferential N-type polysilicons 45n are connected to the source electrode metal coats 29s and 29p via connection holes 25a and 25b, respectively.

Since the zener diode serving as a protection element is formed from the protection element use polysilicon 45 formed in the protection element concave section 43, a protection element can be arranged so that the polysilicon coat is not arranged upper than the surface of the N-type epitaxial layer 3.

Further, since the insulation coat 47 formed on the bottom surface of the protection element use concave section 43 is thicker than that of the gate insulation coat 9, a withstand pressure between the protection element and the semiconductor substrate at the bottom surface of the protection element use concave section 43 can be improved. Thus, a protection element capable of withstanding a high electric filed can be obtained.

Further, since a portion of the gate contact use polysilicon 39 formed in the gate contact use concave section 19 is used as a resistance element, for example, an ESD countermeasure use gate protection resistance in this example, a resistance element can be arranged so that a polysilicon coat is not arranged upper than the surface of the N-type epitaxial layer 3.

Further, the upper surfaces of the gate use polysilicon coat, the gate contact use polysilicon, and the resistance element use polysilicon drop from that of the semiconductor substrate. Thus, when a silicon oxide coat is formed between the resistance element use polysilicon and the layer interval insulation coat and separated, with an interval, from a sidewall of the resistance element use concave section with its upper surface being the same level with the surface of the semiconductor substrate, flatness of the surface of the semiconductor substrate can be more improved.

Now, with reference to FIGS. 10A to 12C, another embodiment of a manufacturing method implemented in a semiconductor apparatus and including the other manufacturing processes is described.

As shown in FIG. 10A, using the similar process to that described with reference to FIG. 1A, a N-type epitaxial layer 3, a trench 7, a gate contact use concave section 19, and a protection element use concave section 43 are formed.

As shown in FIG. 10B, using a photoengraving technology, a photo resist 49 having an opening in a protection element use concave section 43 is formed on an N-type epitaxial layer 3. By means of an ion injection technology, arsenic (x) is injected to the bottom surface of the protection element use concave section 43 under a condition that a dose amount is $3 \times 10^5/cm^2$, for example.

As shown in FIG. 10C, the photo-resist 49 is then removed. A gate insulation coat 9 including a silicon oxide coat having a thickness of about 25 nm is formed on the surface of the N-type epitaxial layer 3, the trench 7, the inner walls of the gate contact use concave section 19, and the sidewall of the protection element use concave section 43 by executing heat oxidation processing. At this moment, an insulation coat 47 including a silicon oxide coat having a thickness of about 75 nm is formed on the bottom surface of the protection element use concave section 43 due to the arsenic ion injection. For example, with the CVD method, a non-dope polysilicon coat 51 with a thickness of about 1.0 micrometer without impurity is formed under a condition that temperature is 620 degrees centigrade. Here, the trench with a width of 0.5 micrometer is completely embedded, and thus, the surface of the polysilicon coat 33 is almost flat overlying the trench 7. However, each of the gate contact use concave section 19 and the protection element use concave section 43 is not completely embedded, and thus, a concave section 51 appears on the surfaces of the polysilicon coat 51 overlying the gate contact use concave section 19 and the protection element use concave section 43.

A silicon oxide coat 37 including a SOG coat having a thickness of 400 nm on an upper layer side and an NSG coat having a thickness of 400 nm on a lower layer side is formed on the polysilicon coat 33. The concave section 51a of the polysilicon coat 51 is embedded with the silicon oxide coat 37.

Figure 11A:
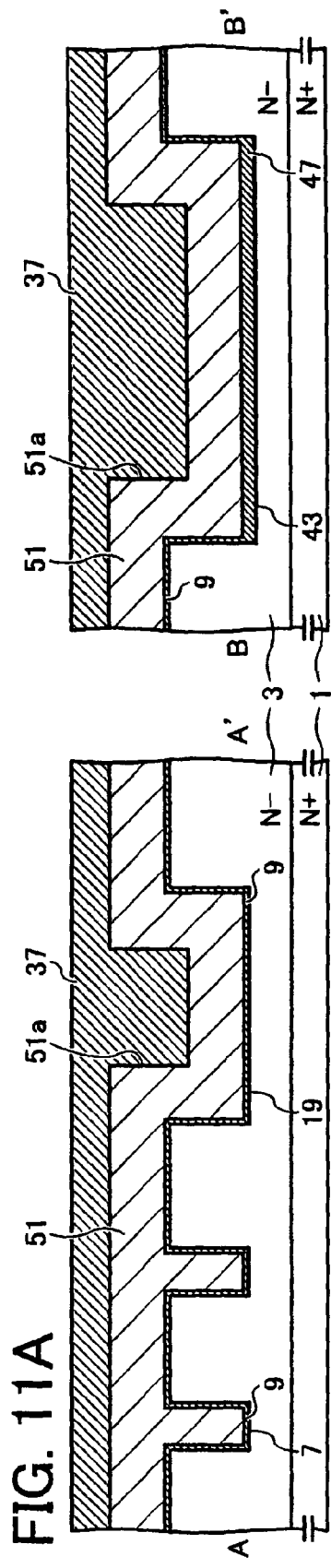
FIG. 11 illustrates a cross sectional view illustrating the subsequent processes of the above-mentioned initial stage of the processes.

As shown in FIG. 11A, a silicon oxide coat 37 is formed overlying the polysilicon coat 51 by including a SOG coat having a thickness of 400 nm on an upper layer side and an NSG coat having a thickness of 400 nm on a lower layer side. The concave section 51a of the polysilicon coat 51 is embedded with the silicon oxide coat 37.

Figure 11B:
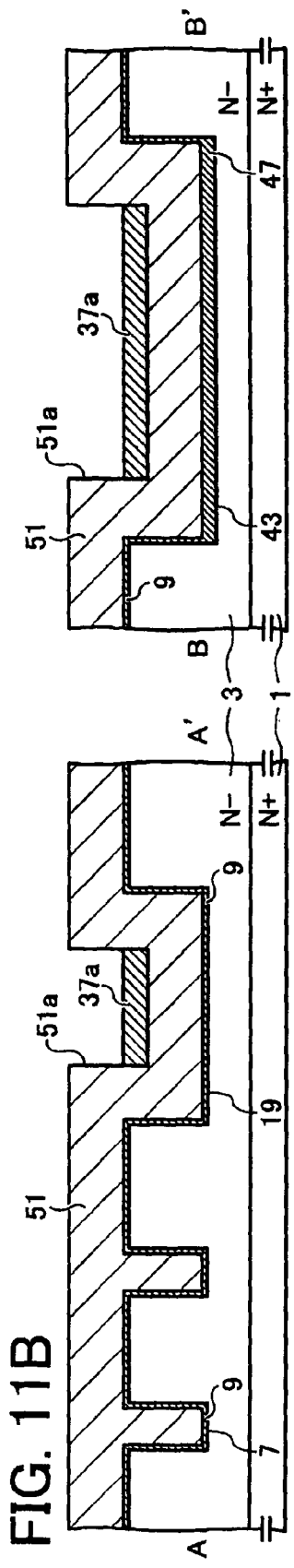

As shown in FIG. 11B, similar to the process described with reference to FIG. 7B, a silicon oxide coat 37a having a thickness of 0.5 micrometer remains only in the concave section 51a.

Figure 11C:
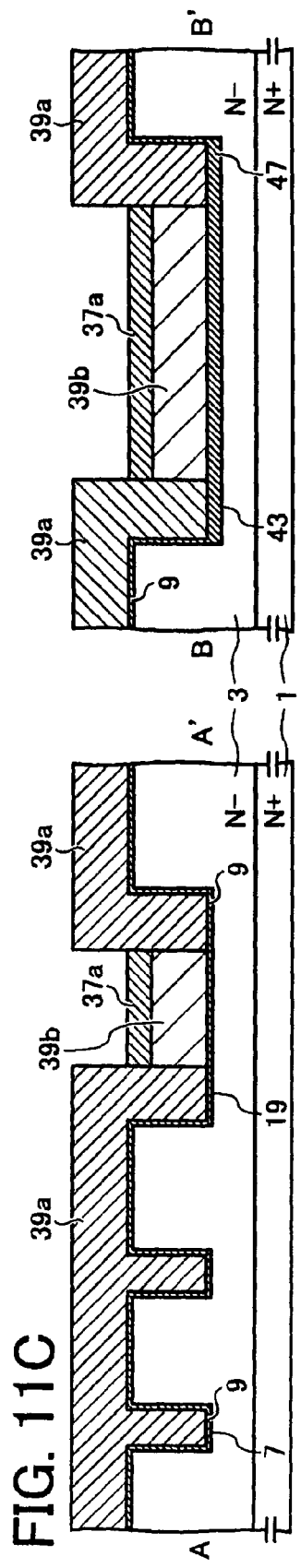
Figure 13A:
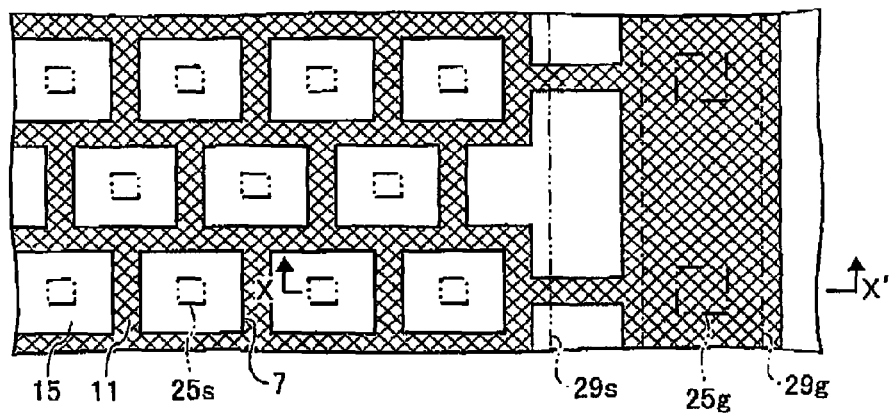
FIG. 13A is a plan view illustrating a configuration of a conventional power MOSFET.
Figure 13B:
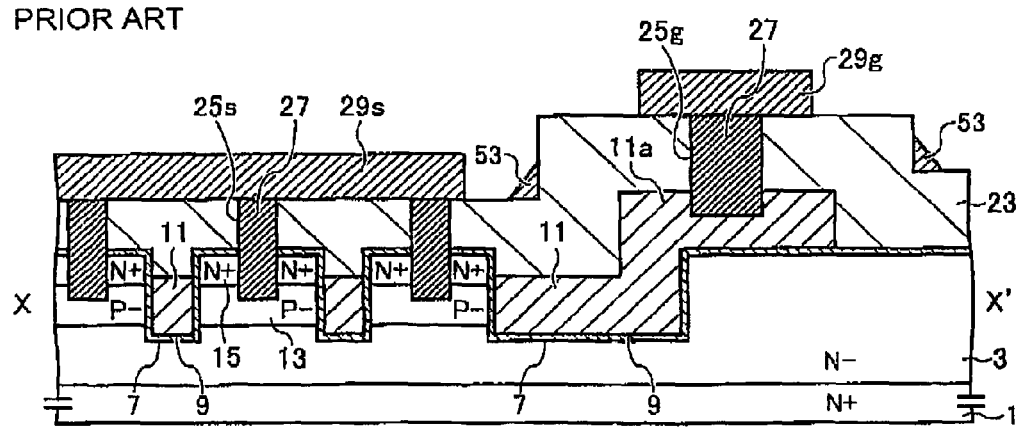
FIG. 13B is a cross sectional view illustrating the conventional power MOSFET when viewed from a section along with an extension line X-X' as drawn in FIG. 13A.

As shown in FIG. 11C, a heat processing is executed under conditions that ambient temperature is 960 degrees centigrade and includes argon gas with $PH_3$ of 1%. Thus, phosphor is diffused into the polysilicon coat 51 in a solid state, and accordingly, the polysilicon coat 51 other than its portion below the silicon oxide coat 37a is made into a low resistance, thereby a low resistance polysilicon 39a is obtained. The polysilicon coat 51 below the silicon oxide coat 37a is made into a high resistance polysilicon 39b. Then, applying wet etching, a phosphor glass formed after the heat processing is removed.

Even the silicon oxide coat 37a is etched during the wet etching, affection therefrom is negligible.

As shown in FIG. 12A, using a microwave plasma etching apparatus, for example, the low resistance polysilicon 33 receives anisotropic etching to be processed to have a prescribed recess amount of 0.5 micrometer under conditions that a microwave power is 400 W, a mixture gas includes $Cl_2$ of 45 sccm, HBr of 75 sccm, and $O_2$ of 3 sccm, a pressure is 0.5 Pa, and a RF power is 300 W. At this moment, the high resistance polysilicon 39b below the silicon oxide coat 37a is not etched. Then, the silicon oxide coat 37a on the high resistance polysilicon 39b in the protection element use concave section 43 is removed. Since a thickness of the polysilicon coat 51 is calculated by subtracting the recess amount from the depth of the trench, polysilicon coats 39a and 39b are embedded being flat into the trench, the gate contact use concave section 19 and the protection element use concave section 43 after anisotropic etching is applied to the polysilicon coat 39a. Further, since a thickness of the silicon oxide coat 37a is adjusted to be the recess amount of 0.5 micrometer, the surface of the silicon oxide coat 37a coincides with that of the N-type epitaxial layer 3. However, owing to an uneven thickness created during coat formation of the polysilicon coat 51 and uneven etching caused during recess amount adjustment, a small step sometimes appears on the upper surface of the gate contact use polysilicon 21. An anisotropic etching, such as a CDE, etc., can be executed as etching back processing as mentioned above with reference to FIG. 5. Further, when the silicon oxide coat 37a is removed from the high resistance polysilicon 39b in the protection element use concave section 43, the silicon oxide coat 37a can be removed from the high resistance polysilicon 39b in the gate contact use concave section 19.

As shown in FIG. 12B, when the silicon oxide coat 37a remains on the high resistance polysilicon 39b in the gate contact use concave section 19, a P-layer 13 and an N-type source diffusion layer 15 are formed on the N-type epitaxial layer 3 of the cell section 5 using the photo engraving technology or the ion injection technology. In addition, a N-type polysilicon 45n, a P-type polysilicon 45p, and a N-type polysilicon 45n are arranged on the high resistance polysilicon coat 39b in the protection element use concave section 43 so as to form a zener diode.

As shown in FIG. 12B, using the CVD method, a layer interval insulation coat 23 including a laminate coat formed from NSG and BPSG coats and having a thickness of about 800 nm is formed all over on the surface of the N-type epitaxial layer 3 including formation sections for a protection element and a gate contact section 17 and the cell section 5. Since a polysilicon coat is not formed upper than the surface of the N-type epitaxial layer 3, a step is not formed on the surface of the N-type epitaxial layer 3 due to the polysilicon coat, and thereby, the upper surface of the layer interval insulation coat 23 can be flat. Further, since a silicon oxide coat 37a is formed on the gate contact use polysilicon 21, flatness of the layer interval insulation coat 23 can be improved on the gate contact use polysilicon 21. Using the photo engraving technology or the etching technology, a plurality of connection holes 25g, 25s, 25d, 25a and 25b are formed as also illustrated in FIG. 8.

As shown in FIGS. 6A and 6B, similar to the process as described in FIG. 8B with reference to FIGS. 1A and 1B, a conductive plug 27, and a plurality of electrode coats 29g, 29s, and 29d, and a passivation coat 30, as well as a pad opening section are formed.

In the above-mentioned embodiments, the size of the polysilicon coat is calculated by subtracting the recess amount from the depth of the concave section when the polysilicon is embedded into the concave section including the trench formed on the N-type epitaxial layer 3. However, the present invention is not limited thereto, and alternatively, a polysilicon coat can be completely embedded into a concave section formed on the surface of a semiconductor substrate. In such a situation, if the polysilicon coat is formed so that the upper surface thereof becomes flat while applying an etching back process without using a mask use insulation coat, polysilicon embedded into the concave sections can be flat.

When a protection element use concave section and a protection element use polysilicon are to be formed, and if an upper surface of a non-dope polysilicon coat is made flat, an impurity is then introduced, a low polysilicon is then formed while forming a mask on the non-dope polysilicon coat on the protection element use concave section (or a combination of the protection element use concave section and a resistance element use concave section), an etching back process is then applied to the non-dope polysilicon coat (for example, a high resistance polysilicon) and the low resistance polysilicon after removal of the mask, a high resistance polysilicon can be formed within the protection element use concave section (or the protection element use concave section and the resistance element use concave section). Further, when the polysilicon coat is completely embedded into the concave section, the upper surface of the polysilicon coat is not necessarily completely flat.

Figure 8C:
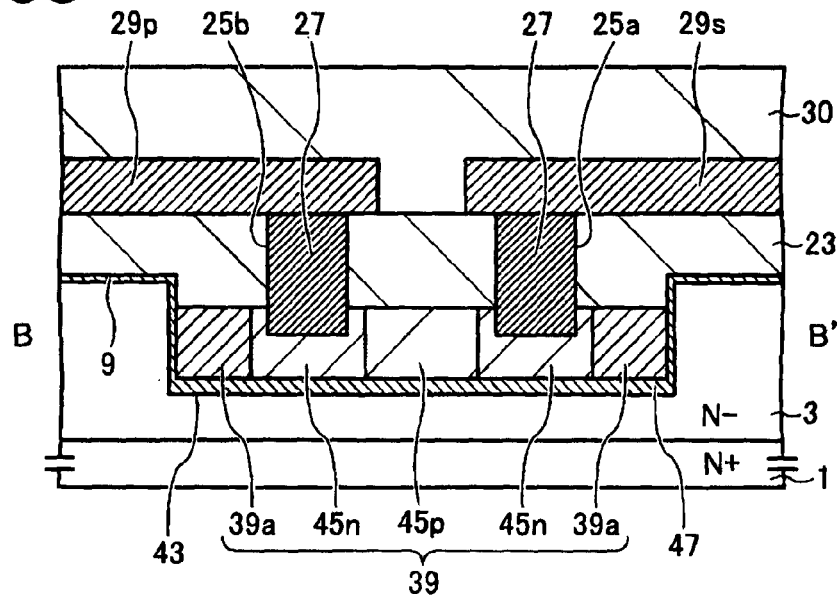
FIG. 8C is a cross sectional view illustrating the exemplary semiconductor apparatus of FIG. 8A when viewed from a section along with an extension line B-B' as drawn in FIG. 8A.

Further, in FIGS. 1A and 1B and 6A and 6B, similar to the embodiment described with reference to FIGS. 8A to 8C, when a region not forming a gate use connection hole 25g nor a gate electrode metal coat 29g is arranged on the gate contact use polysilicon 21, the gate contact use polysilicon 21 of the region can function as a resistance element.

Further, the above-mentioned embodiment, the present invention is applied to the N-channel type power MOSFET. However, when a P-type semiconductor substrate is used and a power MOSFET of a reverse conductive type to that of the embodiment is produced, the present invention can also be applied to the P-channel type power MOSFET. Further, when a silicon substrate and an exipaxial layer having a different conductive type from each other is used, the present invention can also be applied to an IGBT.

Further, an arrangement of a transistor in the cell section 5 can be a lattice or stripe state. A planar shape of the cell is not limited to a rectangular, but includes a circle and an ellipsis. Further, in the above-mentioned embodiments, only a typical type of the insulation layers is exemplified. However, the other type can be employed.

Further, various conductive metals can be used for the electrodes 29g, 29s, and 29d, and the conductive plug 27 or the like. Further, the p-type body diffusion layer 13 and the N-type source diffusion layer 15 can be formed before formation of the trench 7.

Further, as mentioned, the semiconductor substrate employs the epitaxial layer 3 formed on the silicon substrate 1. However, the semiconductor can employ an impurity diffusion layer formed on the silicon substrate surface. Further, not only a silicon substrate, but also a SiC substrate or the like can be used as a semiconductor substrate.

Further, according to the above-mentioned embodiments, the layer interval insulation coat 23 is formed all over the surface of the semiconductor substrate. However, the present invention is not limited thereto, and is applicable to a modification in which a layer interval insulation coat is at least formed overlying a polysilicon coat in a concave section formed on a semiconductor substrate. The layer interval insulation coat can be formed on the polysilicon coat either being dropped from the semiconductor surface or at the same level therewith. Still otherwise, the layer interval insulation coat can be formed protruding around the concave section on the surface of the semiconductor substrate.

Further, not only arranging only one resistance element, but also a plurality of resistance elements can be arranged. In such a situation, a width and a length of a resistance element use concave section of the resistance element or amount of introduced impurity can be differentiated from each other so as to differentiate a resistance value from each other.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor apparatus comprising:
 a cell section including at least two transistors, said cell section including:
  a drain layer including a semiconductor substrate,
  a trench formed on the surface of the semiconductor substrate having a depth reaching the drain layer,
  a gate electrode use polysilicon formed in the trench via a gate insulation coat,
  a body diffusion layer formed overlying the semiconductor substrate, said body diffusion layer neighboring the trench and shallower than the trench, and
  a source diffusion layer formed overlying the semiconductor substrate, said source diffusion layer neighboring the trench and the body diffusion layer and shallower than the body diffusion layer,
 a gate contact section including;
  a gate contact use concave section formed overlying the semiconductor substrate, said gate contact use concave section being separated from the cell section and formed in succession with the trench and having a larger width than that of the trench, and a gate contact use polysilicon formed in the gate contact use concave section via an insulation coat and electrically connected to the gate electrode use polysilicon, a layer interval insulation coat formed at least overlying the gate electrode use polysilicon and the gate contact use polysilicon;

a source electrode metal coat formed overlying the semiconductor substrate, said source electrode metal coat being insulated from the gate electrode use polysilicon and the gate contact use polysilicon, and being electrically connected to the body diffusion layer and the source diffusion layer;

a gate use connection hole formed on the layer interval insulation coat overlying the gate contact use polysilicon, said gate use connection hole having a width larger than that of the trench; and a gate electrode metal coat formed on the rate use connection hole and the layer interval insulation coat;

wherein the gate contact use polysilicon is formed one of at the same level with and lower than the surface of the semiconductor substrate, and wherein the upper surfaces of the gate electrode use polysilicon and the gate contact use polysilicon are lower than the surface of the semiconductor substrate, further comprising a silicon oxide coat formed between the gate contact use polysilicon and the layer interval insulation coat and being separated with an interval from a sidewall of the gate contact use concave section, the upper surface of said silicon oxide coat being the same level with the surface of the semiconductor substrate.

2. A semiconductor apparatus comprising:
a cell section including at least two transistors, said cell section including:
  a drain layer including a semiconductor substrate,
  a trench formed on the surface of the semiconductor substrate having a depth reaching the drain layer,
  a gate electrode use polysilicon formed in the trench via a gate insulation coat,
  a body diffusion layer formed overlying the semiconductor substrate, said body diffusion layer neighboring the trench and shallower than the trench, and
  a source diffusion layer formed overlying the semiconductor substrate, said source diffusion layer neighboring the trench and the body diffusion layer and shallower than the body diffusion layer,
a gate contact section including;
  a gate contact use concave section formed overlying the semiconductor substrate, said gate contact use concave section being separated from the cell section and formed in succession with the trench and having a larger width than that of the trench, and
  a gate contact use polysilicon formed in the gate contact use concave section via an insulation coat and electrically connected to the gate electrode use polysilicon,
  a layer interval insulation coat formed at least overlying the gate electrode use polysilicon and the gate contact use polysilicon;
  a source electrode metal coat formed overlying the semiconductor substrate, said source electrode metal coat being insulated from the gate electrode use polysilicon and the gate contact use polysilicon, and being electrically connected to the body diffusion layer and the source diffusion layer;
  a gate use connection hole formed on the layer interval insulation coat overlying the gate contact use polysilicon, said gate use connection hole having a width larger than that of the trench; and
  a gate electrode metal coat formed on the gate use connection hole and the layer interval insulation coat;
a protection element use concave section formed on the surface of the semiconductor substrate with a larger width than that of the trench; and
a protection element having a PN diode formed from a protection element use polysilicon, said PN diode being formed in the protection element use concave section via an insulation coat,
wherein the gate contact use polysilicon is formed one of at the same level with and lower than the surface of the semiconductor substrate, and
wherein said layer interval insulation coat is also formed on the protection element use polysilicon, and the protection element use polysilicon is electrically connected between the source electrode metal coat and the gate electrode metal coat.

3. The semiconductor apparatus according to claim 2, wherein said insulation coat formed on the bottom surface of the protection element use concave section is thicker than the gate insulation coat.

4. The semiconductor apparatus according to claim 2,
wherein the upper surfaces of the gate electrode use polysilicon, the gate contact use polysilicon, and the protection element use concave section are lower than the surface of the semiconductor substrate,
wherein a silicon oxide coat is formed between the gate contact use polysilicon and the layer interval insulation coat and being separate with an interval from a sidewall of the gate contact use concave section, the upper surface of said silicon oxide coat being the same level with the surface of the semiconductor substrate, and
wherein the silicon oxide coat excluded between the protection element use polysilicon and the layer interval insulation coat.

5. A semiconductor apparatus comprising:
a cell section including at least two transistors, said cell section including;
  a drain layer including a semiconductor substrate,
  a trench formed on the surface of the semiconductor substrate having a depth reaching the drain layer,
  a gate electrode use polysilicon formed in the trench via a gate insulation coat,
  a body diffusion layer formed overlying the semiconductor substrate, said body diffusion layer neighboring the trench and shallower than the trench, and
  a source diffusion layer formed overlying the semiconductor substrate, said source diffusion layer neighboring the trench and the body diffusion layer and shallower than the body diffusion layer,
a gate contact section including;
  a gate contact use concave section formed overlying the semiconductor substrate, said gate contact use concave section being separated from the cell section and formed in succession with the trench and having a larger width than that of the trench, and
  a gate contact use polysilicon formed in the gate contact use concave section via an insulation coat and electrically connected to the gate electrode use polysilicon,
a layer interval insulation coat formed at least overlying the gate electrode use polysilicon and the gate contact use polysilicon;
a source electrode metal coat formed overlying the semiconductor substrate, said source electrode metal coat being insulated from the gate electrode use polysilicon and the gate contact use polysilicon and being electrically connected to the body diffusion layer and the source diffusion layer;

a gate use connection hole formed on the layer interval insulation coat overlying the gate contact use polysilicon, said gate use connection hole having a width larger than that of the trench; and a gate electrode metal coat formed on the gate use connection hole and the layer interval insulation coat;

a resistance element use concave section formed on the surface of the semiconductor substrate with a larger width than that of the trench, and a resistance element use polysilicon arranged in the resistance element use concave section via an insulation coat;

wherein the gate contact use polysilicon is formed one of at the same level with and lower than the surface of the semiconductor substrate, and wherein said layer interval insulation coat is also formed overlying the resistance element use polysilicon.

6. The semiconductor apparatus according to claim 5, wherein the upper surfaces of the gate electrode use polysilicon, gate contact use polysilicon, and the resistance element use polysilicon are lower than the surface of the semiconductor substrate, further comprising a silicon oxide coat formed between the resistance element use polysilicon and the layer interval insulation coat and being separated with an interval from a sidewall of the resistance element use concave section, the upper surface of said silicon oxide coat being substantially the same level with the surface of the semiconductor substrate.

7. The semiconductor apparatus according to claim 5, wherein a resistance of the resistance element use polysilicon is determined by a length and a width of the resistance element use concave section as well as a coat thickness of the resistance element use polysilicon.

8. The semiconductor apparatus according to claim 5, wherein a resistance of the resistance element use polysilicon is determined by density of impurity introduced to the resistance element use polysilicon.

* * * * *